(12) United States Patent
Kilger et al.

(10) Patent No.: US 10,930,541 B2
(45) Date of Patent: Feb. 23, 2021

(54) METHOD OF FORMING A CHIP ARRANGEMENT, CHIP ARRANGEMENT, METHOD OF FORMING A CHIP PACKAGE, AND CHIP PACKAGE

(71) Applicant: Infineon Technologies AG, Neubiberg (DE)

(72) Inventors: Thomas Kilger, Regenstauf (DE); Francesca Arcioni, Munich (DE); Maciej Wojnowski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/249,142

(22) Filed: Jan. 16, 2019

(65) Prior Publication Data

US 2019/0221465 A1     Jul. 18, 2019

(30) Foreign Application Priority Data

Jan. 17, 2018    (DE) ..................... 10 2018 100 958.5

(51) Int. Cl.
*H01L 21/683*      (2006.01)
*H01L 21/56*       (2006.01)
(Continued)

(52) U.S. Cl.
CPC .......... *H01L 21/6835* (2013.01); *H01L 21/56* (2013.01); *H01L 21/561* (2013.01); *H01L 21/568* (2013.01); *H01L 23/3114* (2013.01); *H01L 23/3135* (2013.01); *H01L 23/48* (2013.01); *H01L 23/66* (2013.01); *H01L 24/02* (2013.01); *H01L 2221/68327* (2013.01); *H01L 2221/68377* (2013.01);
(Continued)

(58) Field of Classification Search
CPC ..................... H01L 24/20; H01L 24/02; H01L 2221/68377; H01L 2221/68327; H01L 23/3114; H01L 21/56; H01L 23/3135; H01L 2924/15153; H01L 2224/0231; H01L 2224/02381; H01L 2224/06181; H01L 2221/06381; H01L 21/568; H01L 21/561; H01L 24/27; H01L 24/96; H01L 2224/0555; H01L 23/48; H01L 24/19; H01L 2221/68331
See application file for complete search history.

(56) References Cited

U.S. PATENT DOCUMENTS

| | | | |
|---|---|---|---|
| 2004/0113283 A1* | 6/2004 | Farnworth | .......... H01L 21/6835 257/782 |
| 2012/0104574 A1 | 5/2012 | Boeck et al. | |
| 2016/0181138 A1 | 6/2016 | Meyer-Berg et al. | |

FOREIGN PATENT DOCUMENTS

| | | |
|---|---|---|
| DE | 19806818 C1 | 11/1999 |
| DE | 102006025671 A1 | 12/2007 |

* cited by examiner

*Primary Examiner* — Jasmine J Clark
(74) *Attorney, Agent, or Firm* — Murphy, Bilak & Homiller, PLLC

(57) ABSTRACT

A method of forming a chip arrangement is provided. The method includes: arranging a plurality of stacks on a carrier, each stack including a thinned semiconductor chip, a further layer, and a polymer layer between the further layer and the chip, each stack being arranged with the chip facing the carrier; joining the plurality of stacks with each other with an encapsulation material to form the chip arrangement; exposing the further layer; and forming a redistribution layer contacting the chips of the chip arrangement.

32 Claims, 11 Drawing Sheets

(51) Int. Cl.
*H01L 23/66* (2006.01)
*H01L 23/31* (2006.01)
*H01L 23/48* (2006.01)
*H01L 23/00* (2006.01)

(52) U.S. Cl.
CPC ............... *H01L 2221/68381* (2013.01); *H01L 2224/0231* (2013.01); *H01L 2224/02381* (2013.01)

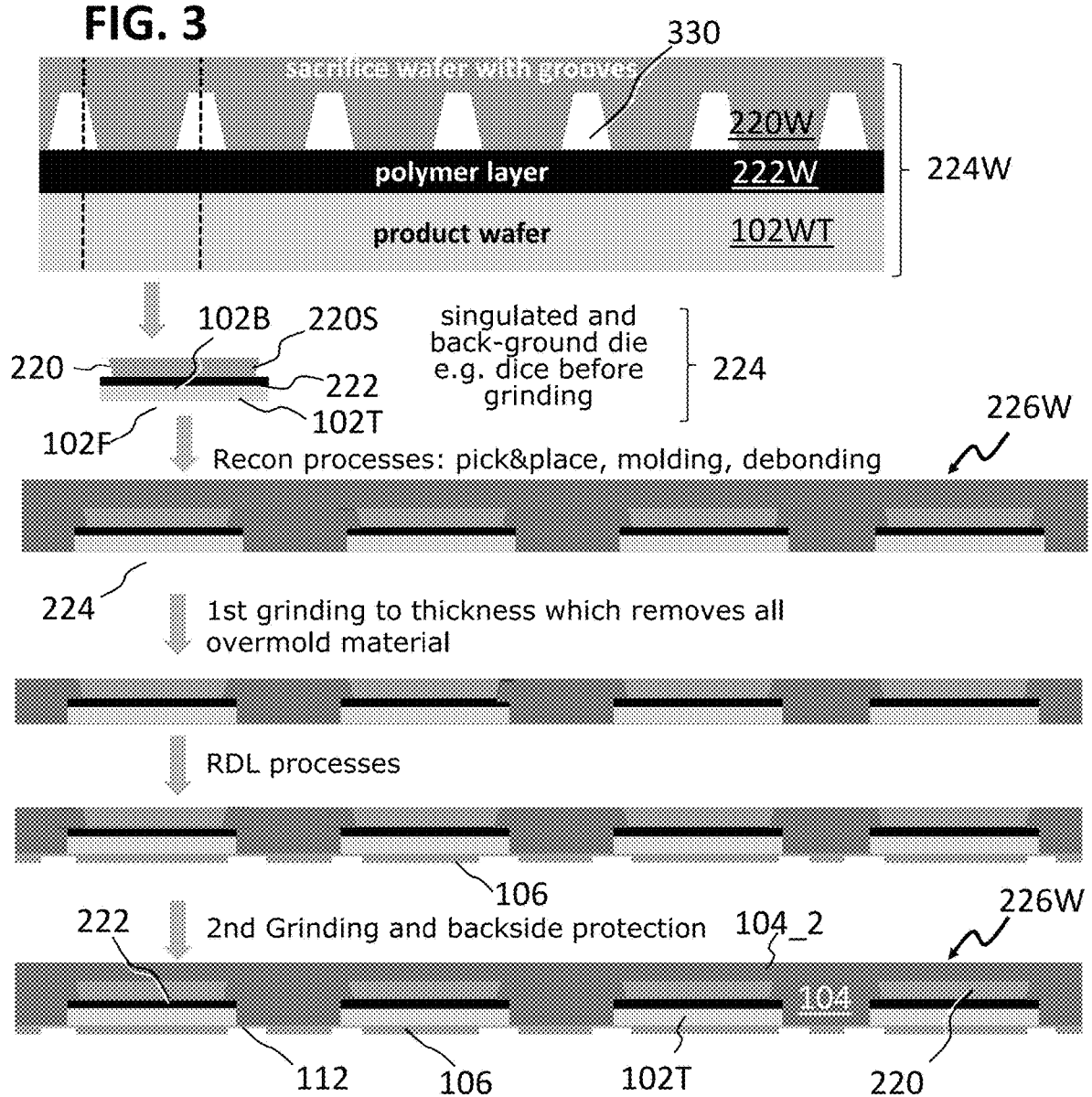

FIG. 7

| 700 |

- 710 arranging a plurality of stacks on a carrier, each of the stacks including a thinned semiconductor chip, a further layer, and a polymer layer between the further layer and the chip, wherein each of the stacks is arranged with the chip facing the carrier
- 720 joining the plurality of stacks with each other with an encapsulation material to form a chip arrangement
- 730 exposing the further layer
- 740 forming a redistribution layer contacting the chips of the chip arrangement
- 750 removing the further layer, thereby exposing the polymer layer

| arranging a plurality of stacks on a carrier, each of the stacks including a thinned semiconductor chip and a further layer, wherein the further layer comprises at least one gas-filled cavity, and wherein each of the stacks is arranged with the chip facing the carrier | 810 |

↓

| joining the plurality of stacks with each other with an encapsulation material to form a chip arrangement | 820 |

↓

| exposing the further layer | 830 |

↓

| forming a redistribution layer contacting the chips of the chip arrangement | 840 |

METHOD OF FORMING A CHIP ARRANGEMENT, CHIP ARRANGEMENT, METHOD OF FORMING A CHIP PACKAGE, AND CHIP PACKAGE

TECHNICAL FIELD

Various embodiments relate generally to a method of forming a chip arrangement, a chip arrangement, a method of forming a chip package, and to a chip package.

BACKGROUND

In embedded wafer-level ball-grid arrays (eWLBs), semiconductor dies (also referred to as chips) are at present used in two different configurations regarding their thickness compared to the mold thickness. In a so-called "thick" (also referred to as "standard") configuration, which is shown in FIG. 1A, the dies 102 have a standard thickness of wafers 102W (e.g. 725 μm for wafers having an 8" diameter). In this case, an overmolded material 104 after making an artificial wafer 110 (also referred to as "reconstituted wafer" or "recon") is removed by grinding. This may be necessary for a further processing, for example because only recons having a certain thickness can be handled in processes for forming a re-distribution layer 106 (RDL). This is the "standard" eWLB process. A second possibility, which is shown in FIG. 1B, is to use thinner dies 102T (from thinned wafers 102WT) and to overmold only to the thickness that can be handled in the RDL processes. This is the so-called "slim" configuration. Both, the thick and the slim configuration, have disadvantages. Please refer to the following table comparing the standard eWLB with the slim eWLB:

| | standard eWLB | slim eWLB |
|---|---|---|
| die thickness | full wafer thickness; e.g. 725 μm for 8" | ground wafer; e.g. 370 μm |
| molding thickness | e.g. 860 μm for safe overmolding | e.g. 490 μm for safe overmolding |
| 1$^{st}$ grinding (before RDL) | 690 μm | no grinding |
| warpage behavior during RDL-processes | relatively stable; warpage adjustable | severe warping; adjustment difficult |
| 2$^{nd}$ grinding (before ball apply) | e.g. 450 μm | e.g. 450 μm |
| advantage | more stable warpage ⇒ no mold over Si | lower costs ⇒ no first grinding |
| disadvantage | grinding of Si causes grooves that act as starting points for cracks | unpredictable warping behavior; scrap of lots if adjustment is impossible |

In addition, the standard eWLB provides relatively thick semiconductor dies 102 in the application. In radio frequency (RF-)applications e.g. radar, meaning applications with frequencies above 10 GHz or even above 50 GHz, this thick semiconductor may lead to cross talk of channels and/or other unwanted high frequency behavior, because RF-signals can spread in the semiconductor bulk material. This is typically prevented from an active side of the chip by design and special features like implanting. However, the RF-signals may also spread to the side wall of the semiconductor bulk material. Such a situation is schematically shown in FIG. 4A for a an eWLB having a thick chip 102, with arrows 442 indicating the RF-signals that spread to the side wall of the chip 102. Signals from a specific channel may in such a case also influence signals of other channels or even other signals in the IC circuit. This means that the cross talk behavior due to the thick semiconductor (because of the large sidewall area of e.g. silicon) is an essential disadvantage of the standard chip package. Using a thin chip 102T in the eWLB chip package, as shown in FIG. 4B, may reduce the cross-talk, but suffers from the warping as described above.

SUMMARY

A method of forming a chip arrangement is provided. The method may include arranging a plurality of stacks on a carrier, each of the stacks comprising a thinned semiconductor chip, a further layer, and a polymer layer between the further layer and the chip, wherein each of the stacks is arranged with the chip facing the carrier, joining the plurality of stacks with each other with an encapsulation material to form the chip arrangement, exposing the further layer, and forming a redistribution layer contacting the chips of the chip arrangement.

Those skilled in the art will recognize additional features and advantages upon reading the following detailed description, and upon viewing the accompanying drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a method of forming a chip arrangement in accordance with various embodiments;

FIG. 7 shows a process flow for a method of forming a chip arrangement according to various embodiments;

FIG. 8 shows a process flow for a method of forming a chip arrangement according to various embodiments.

DETAILED DESCRIPTION

Figure 1A:
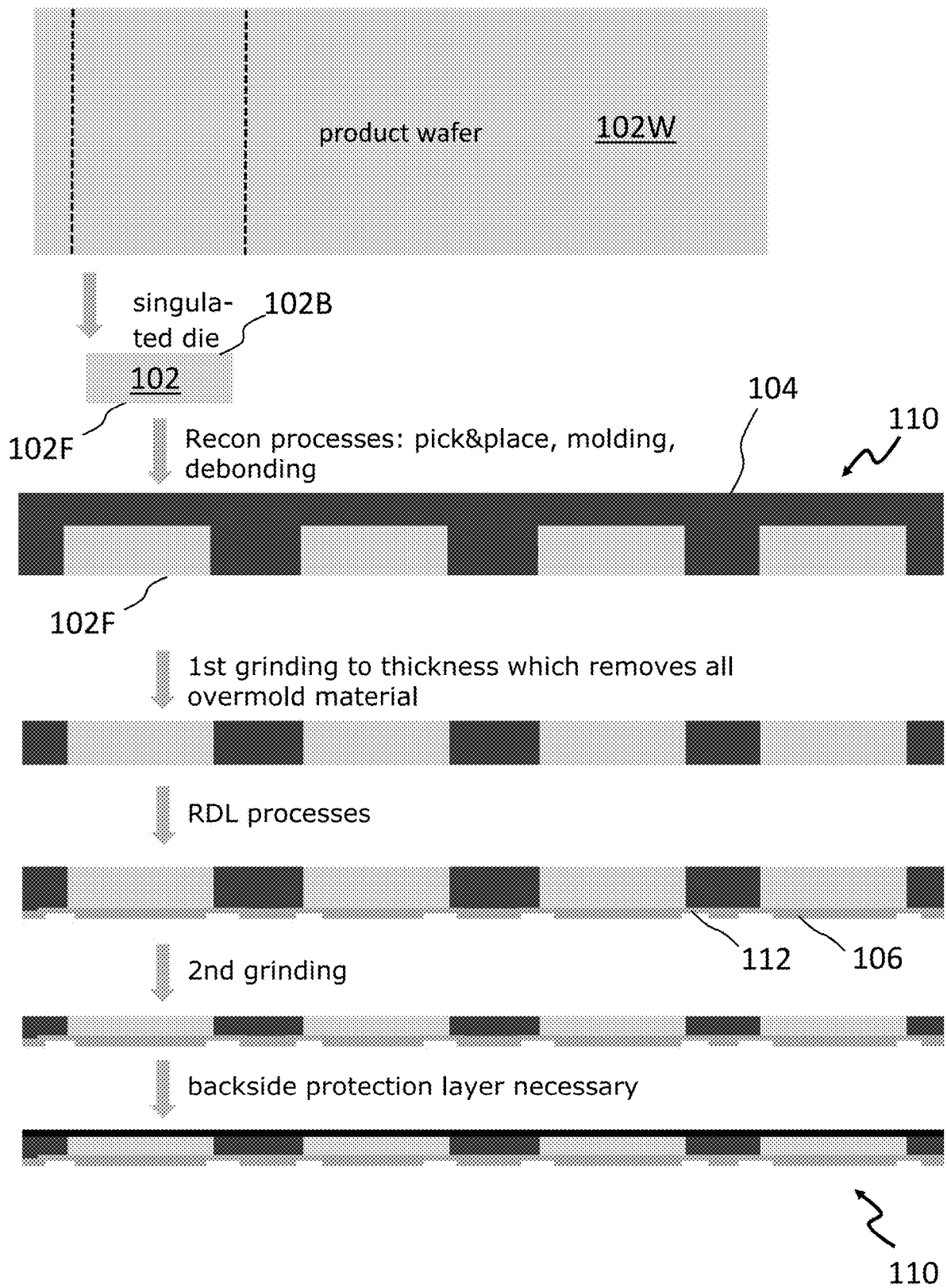
FIG. 1A and FIG. 1B each show a process of forming an embedded wafer level ball grid array.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

Various embodiments are provided of a method of forming a chip arrangement that has a possibility of overcoming or at least alleviating the disadvantages of both methods described above, i.e. the "standard" method and the "slim" method. This means that the chip arrangements in accordance with various embodiments, and likewise chip packages singulated from the chip arrangements, may show neither grooves in the semiconductor material from which the chips are formed, nor the warping (or at least significantly reduced warping).

Furthermore, cross talk of channels and/or other unwanted high frequency behavior may be reduced.

In various embodiments, a stack of a semiconductor wafer (which includes a plurality of semiconductor chips, each of which having at least one electronic component formed therein, also referred to as the product wafer) and a further layer, e.g. a sacrifice wafer, attached to each other with a polymer layer, may be used—instead of the thick chip—for singulating chip stacks for a reconstituted wafer therefrom. The chip stack may imitate the thick die of the standard eWLB, e.g. it may provide the same or a comparable mechanical situation as the thick die during the forming of the redistribution layer (thereby preventing or reducing the warping as compared to the "slim" method), and the polymer layer may provide a backside protection after grinding away the sacrifice wafer/layer, such that it may not be necessary to grind down to the backside of the product wafer (thereby avoiding the grooves in the backside). The semiconductor wafer containing the electrical function (the product wafer) may be kept very thin (thus presenting only a small sidewall area for the coupling of RF signals), such that an RF-behavior may be improved.

In various embodiments, on the one hand, thick dies may be placed for forming the recon, but on the other hand, it may be prevented to have grooves in the semiconductor at a backside of the chip package, which may be considered one of the one of the most critical disadvantages of the standard eWLB.

This may be achieved by stacking a thinned wafer (also referred to as the product wafer) and a further layer, for example a further wafer, e.g. a semiconductor wafer (also referred to as sacrifice wafer). The thinned wafer and the further layer may be attached to each other by a polymer layer. This layer may be thick enough for making it easy to stop a grinding process there during a second grinding (in a process similar to the standard process described above). In addition, this polymer layer may act as a backside protection.

In various embodiments, a risk of a package crack may thereby be lowered compared to the standard eWLB. Furthermore, a risk of severe warpage may be lowered compared to the slim eWLB. Costs may be lowered, because fewer adjustment steps may be necessary, and/or a yield loss may be lowered.

In various embodiments, a cost situation may furthermore be improved, because a backside protection may be less expensive than for the standard eWLB, since the polymer layer is applied to the semiconductor wafer and not to the eWLB wafer (which has a larger area that needs to be covered by the polymer layer). In various embodiments, it may be avoided that a carrier has to be used during the forming of the RDL.

By using a sacrifice wafer which is has a coefficient of thermal expansion (CTE) that is different from the CTE of the product wafer (e.g. using a different semiconductor material than the product wafer or using a glass wafer), the warpage behavior may in various embodiments be adjusted. Also, a thickness ratio between the product wafer and the sacrifice wafer may in various embodiments be used to adjust the warpage behavior of the eWLB wafer.

Compared to the standard eWLB, various embodiments provide a more reliable chip package. In various embodiments, the method of forming a chip arrangement and a chip package, respectively, may be used to adjust the warpage behavior that is causing adjustment costs.

Compared to the slim eWLB, various embodiments prevent wafers that are scrapped due to severe warpage.

Furthermore, for RF-applications, various embodiments provide thin semiconductor dies that help to reduce cross talk and other misfunctions that may arise from RF coupling into the thick semiconductor layer.

If only the RF-coupling is to be avoided, the second grinding may even be stopped in the sacrifice layer (e.g., in the sacrifice semiconductor).

In various embodiments, the polymer layer may act as a backside protection.

A risk of a package crack and of an RF-coupling may in various embodiments be lowered compared to the standard eWLB.

Figure 2A:
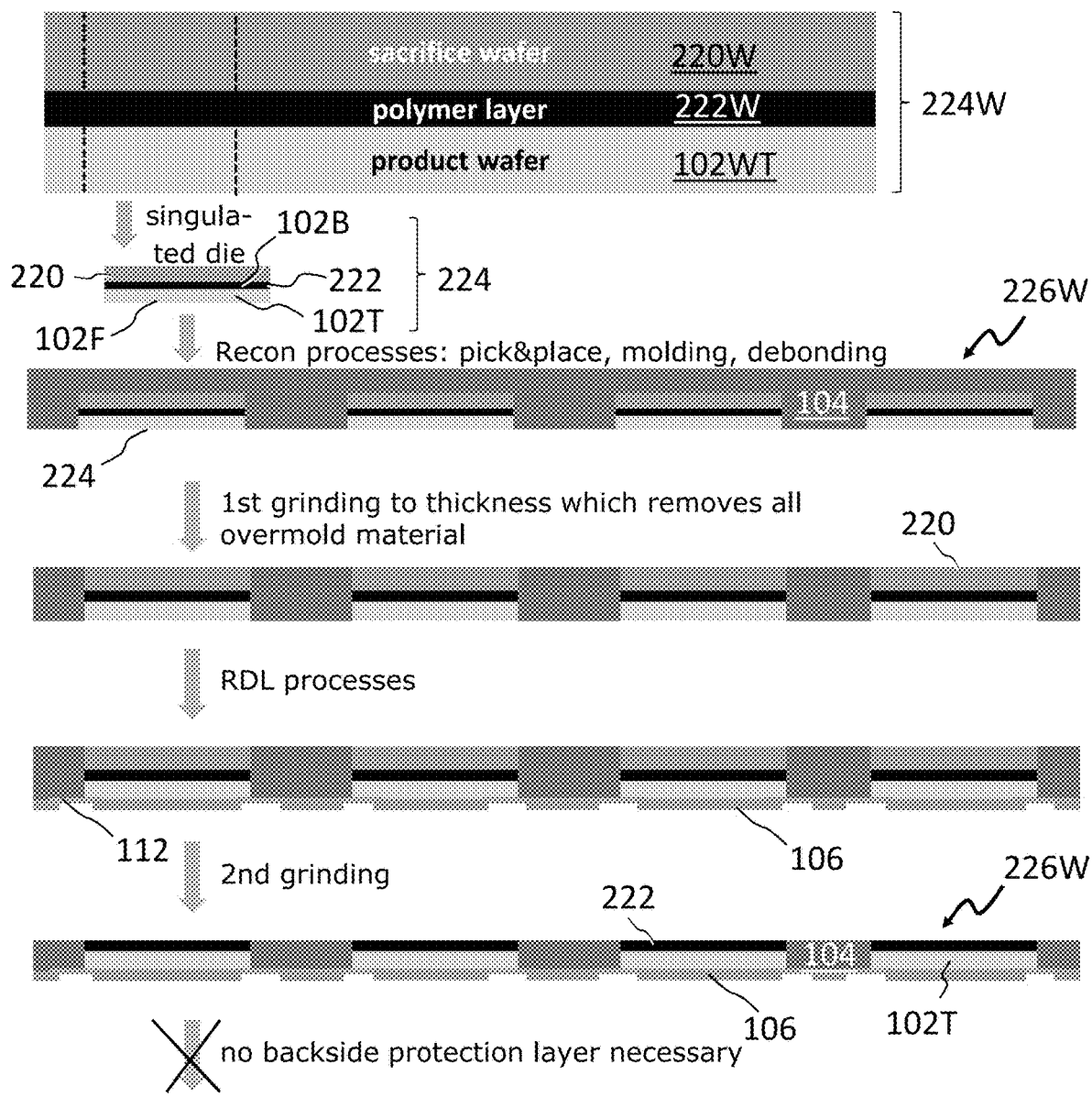
FIG. 2A shows a method of forming a chip arrangement in accordance with various embodiments.
Figure 2B:
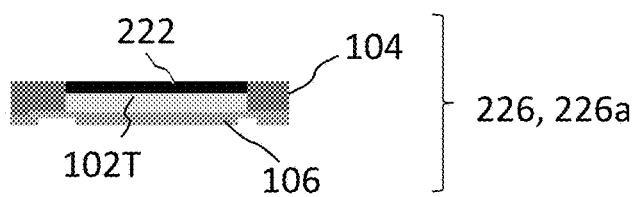
FIG. 2B shows a chip package formed by singulating the chip arrangement of FIG. 2A.

FIG. 2A shows, as a sequence of schematically shown processes, a method of forming a chip arrangement 226W in accordance with various embodiments, and FIG. 2B shows a chip package 226 formed by singulating the chip arrangement 226W of FIG. 2A into individual chip packages 226, which may form the eWLBs 226.

A wafer-sized stack 224W may include a semiconductor wafer 102WT containing a plurality of semiconductor chips 102T, a further layer 220W, and a polymer layer 222W joining the semiconductor wafer 102WT and the further layer 220W. The further layer 220W may be arranged on, e.g. fixed to, a backside of the semiconductor wafer 102T, wherein the backside may be the side of the wafer 102W that is opposite an active side (also referred to as frontside) of the wafer 102W.

A plurality of (chip-sized) stacks 224 may be singulated from the wafer-sized stack 224W. Thus, each stack 224 may include a semiconductor chip 102T, a (chip-sized) further layer 220 and a (chip-sized) polymer layer 222 joining the two. The plurality of stacks 224 may be used for forming the chip arrangement 226W, also referred to as a reconstituted wafer 226W, by arranging them on a carrier (not shown) and overmolding them with an encapsulation material 104 (also referred to as mold material 104), using a molding process and a mold material 104 as known in the art.

The terms "wafer sized" and "chip sized" are used herein to distinguish between structures of wafer-level size and of chip-level size, and are not to be understood to mean that each of the "chip-sized" layers has the same size as the chip 102T, and/or that each of the "wafer-sized" layers has the same size as the semiconductor wafer 102W, even though they may have.

Figure 1B:
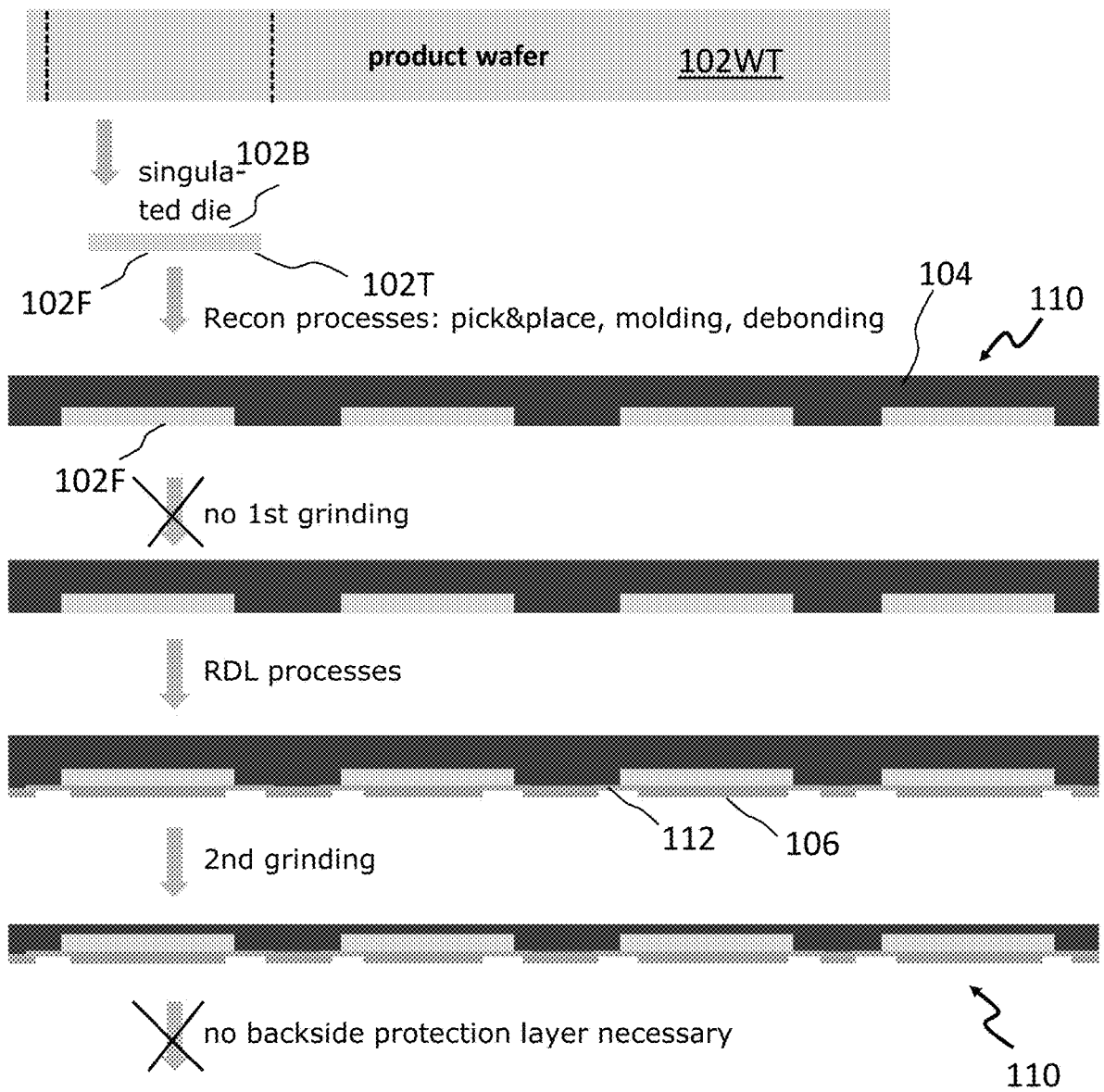

The semiconductor wafer 102WT, and correspondingly each of the plurality of semiconductor chips 102T, may be similar to the thinned wafer/chips 102WT/102T as described in context with FIG. 1B and include at least one electronic component, e.g. an integrated circuit. In particular in a case where the wafer/chip 102WT/102T is to be distinguished from a further layer 220W/220 of the stack 224W/224, the semiconductor wafer 102WT having the electronic component(s) may be referred to as product wafer 102WT, and correspondingly the semiconductor chip 102T of the stack 224 as the product chip 102T. A semiconductor material of the wafer 102WT (and thus of the chip 102T) may include or consist of any semiconductor material typically used for semiconductor chips, for example silicon, germanium, gallium arsenide, silicon carbide, or the like. Dimensions of the semiconductor wafer 102WT may be those of a common thinned semiconductor wafer, for example a thickness in a range from below 10 µm to about 500 µm, e.g. from about 50 µm to about 500 µm, e.g. about 370 µm for a wafer 102WT having a diameter of about 8 inches.

The further layer 220W/220 may include or consist of any material that is suitable for providing mechanical stability during a further processing of the stacks 224. The further processing may include processes for forming and processing the reconstituted wafer 226W, e.g. a pick-and-place (on a carrier) of the individual stacks 224, the molding process for joining the individual stacks to form the reconstituted wafer 226W, a debonding process for decoupling the reconstituted wafer 226W from the carrier, one or more grinding processes, and/or a process of forming a redistribution layer 106 (also referred to as RDL process) over an active side 102F (also referred to as front side 102F) of the chips 102T. During the RDL process, insulating portions 112 may be arranged together with the redistribution layer 106 for insulating parts of the RDL 106 from each other that are not supposed to be in electrical contact. Furthermore, it may be necessary that the material of the further layer 220W/220 is suitable for the grinding process, in other words, that it can be thinned by the grinding process.

Suitable materials of the further layer 220W include semiconductor materials (e.g. silicon, germanium, gallium arsenide, silicon carbide, or the like), wherein the semiconductor material of the further layer 220W/220 may be the same as the material of the product wafer/chip 102WT/102T or a different material.

Further suitable materials of the further layer 220W include dielectric materials like a glass, a ceramic material, a polymer, and the like.

In various embodiments, for example in a case of the further layer remaining in the chip package 226, for example as shown in FIG. 4B to FIG. 4D, FIG. 5A to FIG. 5C and FIG. 6A to FIG. 6C, and/or for adjusting the CTE for the forming of the RDL, suitable materials of the further layer 220W may further include metals and/or laminate structures including one or more of the materials described above.

A thickness of the further layer 220W, 220 may be in a range from about 100 µm to about 750 µm, e.g. from about 300 µm to about 625 µm.

Since the further layer 220W may in various embodiments be completely removed during a further processing of the reconstituted wafer 226W, the further layer 220W may also be referred to as sacrifice layer 220W or sacrifice wafer 220W, respectively, and the corresponding further layer 220 of the chip-sized stack 224 as sacrifice layer 220.

The polymer layer 222W/222 may in various embodiments serve as an adhesive for joining the semiconductor wafer/chip 102WT/102T to the further layer 220W/220. Thus, the polymer material of the polymer layer 222W/222 may in various embodiments be selected in such a way that it adheres to both materials, the semiconductor of the wafer 102W and the material of the further layer 220W. In various embodiments, a primer material may be applied between the semiconductor wafer/chip 102W/102 and the polymer layer 222W/222 and/or the further layer 220W/220 and the polymer layer 222W/222 for improving and/or enabling the adhesion between the respective layers.

In various embodiments, in which the further layer 220W is removed after the forming the RDL, the polymer layer 222W/222 may further be configured to serve as a protection layer. In that case, the polymer layer 222W/222 may protect the chip 102T from environmental influence, charges on the surface, and the like.

In various embodiments, the polymer material may for example include polyurethanes, epoxides or other polymers, which may for example contain filler particles and react chemically so that they are duroplastic or thermoplastic, and the like.

A thickness of the polymer layer 222W/222 may in various embodiments, for example in a case of the further layer 220W being removed after the forming the RDL, be in a range that allows, even in a case of slight thickness variations in the semiconductor wafer 102WT and/or in the further layer 220W, to stop a back-grinding process on the reconstituted wafer 226W in the polymer layer 222W, such that the ground backside surface of the recon 226W is composed of portions of the polymer layer 222W and portions of the mold material 104. In such a case, a minimum thickness may be about 10 µm for the actual grinding process, but may depend on the available technology (and may be reduced in the future). In various embodiments, for example in a case of the further layer remaining in the chip package 226, for example as shown in FIG. 4B to FIG. 4D, FIG. 5A to FIG. 5C and FIG. 6A to FIG. 6C, the thickness of the polymer layer 222W/222 may be thinner than what would be suitable for the above described purpose, for example with a minimum thickness of about 1 µm or even less. The thickness of the polymer layer 222W/222 may be in a range from about 10 µm to about 200 µm, for example from about 20 µm to about 50 µm.

The joining of the semiconductor wafer 102WT to the further layer 220W may include arranging the polymer layer 222W on the backside of the semiconductor wafer 102WT using a known suitable process for the polymer material, e.g. spin-coating, laminating of a polymer layer, etc., and arranging the further layer 220W on the polymer layer 222W. If applicable, a further process may be applied, for example curing the polymer layer 222W.

As shown in the topmost reconstituted wafer 226W of FIG. 2A, after the molding process, the mold 104 may be arranged between the stacks 224. The mold 104 may in various embodiments also be arranged over a backside of the stack 224, which is opposite to the front side 102F of the chips 102T.

A first grinding process may in various embodiments be applied to the backside of the reconstituted wafer 226W for exposing the further layer 220, and for obtaining a thickness of the reconstituted wafer 226W that is suitable for being processed by the machines that form the redistribution layer 106 on the front sides of the chips 102T (also referred to as processable thickness).

A total thickness of the stacks 224 and relative thicknesses of the chip 102T, the polymer layer 222 and the further layer 220 may thus be configured such that the first backside grinding of the reconstituted wafer 226W to the processable thickness ends up in the further layer 220W. In other words, a total thickness of the stacks 224 after the first grinding may correspond to the processable thickness, with all thicknesses (of the chip 102T, the polymer layer 222, and the further layer 220) being larger than zero. An initial thickness of the stack 224 before the first grinding may be larger due to the further layer 220 being thicker. At present, a processable thickness is about 690 μm for an 8 inch wafer, but this value may vary with wafer diameter, technology, etc.

An initial thickness of the reconstituted wafer 226W before the first grinding may be thicker than the processable thickness, at least due to the stacks 224 being thicker, and possibly due to the mold 104 covering the stacks 224.

Any mold 104 covering the stacks 224 may be completely removed during the first grinding process, because otherwise the forming of the redistribution layer 106 may cause warping of the reconstituted wafer 226W, despite the thick stacks 224.

In various embodiments, a material and/or structure (e.g. laminate structure, thickness) of the further layer 220 may be configured to have a thermal expansion during/after the RDL process that reduces or eliminates a warping of the chip arrangement 226W and of the chip package 226 singulated from it. For example, a CTE of the further layer 220 may in various embodiments be larger than or the same as a CTE of the chip 102T, and/or a thickness of the further layer 220 may be larger than, identical to or smaller than a thickness of the chip 102T.

In various embodiments, after the forming of the RDL, a second back grinding may be applied to the chip arrangement 226W. Thereby, the further layer 220 may be removed.

The second back grinding may in various embodiments be continued until the polymer layer 222 is exposed, as shown in the bottom chip arrangement 226W of FIG. 2A. Since the newly created backside of the chip arrangement 226W is formed by a combination of the polymer and the mold, which may be different materials, a backside protection of the chip 102T is provided by the polymer layer 222 of the stacks 224 themselves. Thus, no additional backside protection layer may be necessary.

A thickness of the chip arrangement 226W after the second grinding may be in a range from about 100 μm to about 550 μm, e.g. around 450 μm.

Using a singulation process as known in the art, a chip package 226, 226a as shown in FIG. 2B may be formed from the chip arrangement 226W.

The chip package 226, 226a may thus have a small total thickness, no or only little warping, and no grinding grooves on the backside 102B of the chip 102T, such that its reliability is improved as described above.

As an alternative to the exposing of the polymer layer 222, the second grinding may be omitted or stopped at a point where the further layer 220 of each of the stacks 224 at least partially remains.

A further protection layer 104_2, which may for example include the same material as the mold 104 or a different suitable material, may be arranged over the back side of the chip arrangement 226W.

Figure 4A:
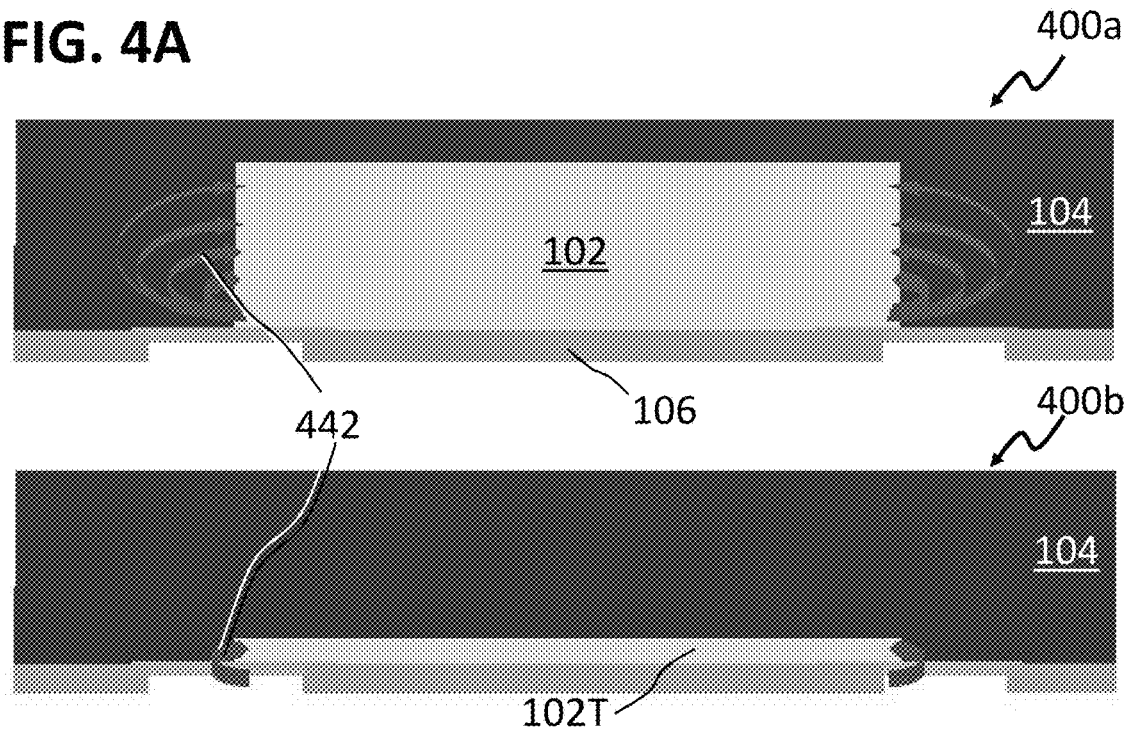
FIG. 4A shows two schematic cross-sectional views of chip packages.
Figure 4B:
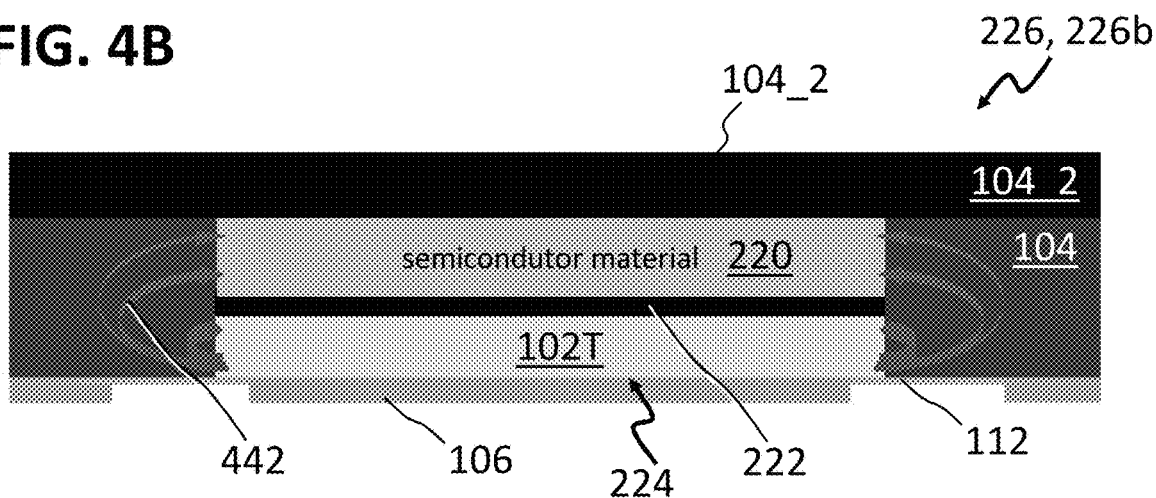
FIGS. 4B to 4F each show a schematic cross-sectional view of a chip package according to various embodiments.
Figure 4C:
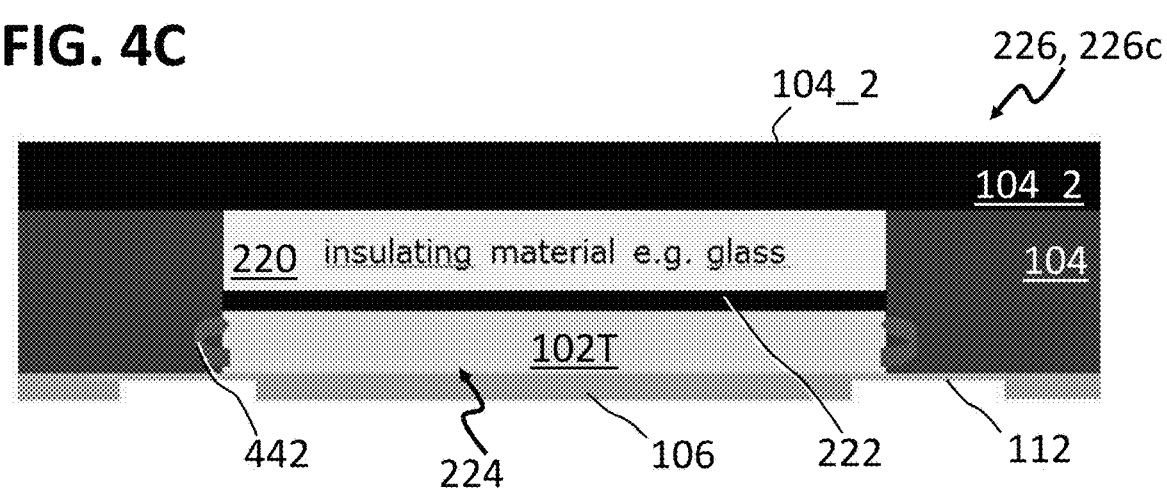

Using a singulation process as known in the art, a chip package 226, 226b as shown in FIG. 4B (with a semiconductor further layer 220), or a chip package 226c as shown in FIG. 4C (with an insulating further layer 220) may be formed, or a chip package similar to those of FIG. 4B and FIG. 4C (with the further layer 220 being neither the semiconductor nor the insulator, e.g. in a case of a multilayer, e.g. laminate, material, a conductive material, etc.).

A thickness of the chip arrangement 226W after the arranging the further protection layer 104_2 may be in a range from about 100 μm to about 550 μm, e.g. around 450 μm. The final thickness depends on the application needs.

The chip package 226, 226a may thus have a high mechanical stability, no or only little warping, and no grinding grooves on the backside 102B of the chip 102T, such that its reliability is improved as described above.

FIG. 4A shows two schematic cross-sectional views of chip packages 400a, 400b as known in the art, wherein FIG. 4A shows a chip package (an eWLB) 400a using a thick chip 102, and a chip package (an eWLB) 400b using a thinned chip 102T.

As described above, the RF-signals 442 may spread in the semiconductor bulk material and lead to back-coupling. The thicker the material, the more coupling occurs, because the RF-signals 442 may spread to the side wall of the chip 102 as an entry point for the RF-signals 442, which may be particularly severe for a thick chip 102 having a large side wall area. For the thinned chip 102T of FIG. 4B, the coupling of RF-signals 442 into the side walls of the thinned thick 102T may be reduced, because the side wall area is smaller. However, the thinned chip 102T may suffer from uncontrollable warping.

The chip package 226a of FIG. 2B has improved RF behavior over the chip package 400a having the thick chip 102, and reduced warping as compared with the chip package 400b, because the reconstituted wafer 226W from which it was formed originally included the stacks 224.

However, in various applications, e.g. if a mechanical stability provided by the stack 224 is desired, and/or in a case of the further layer 220 providing a functionality, e.g. heat dissipation, forming a carrier for an antenna, or for other reasons, it may be desired to leave the further layer 220 in place. In that case, the RF behavior of the chip package 226 may require further consideration.

As illustrated in FIG. 4B, the chip package 226b may already be advantageous over the chip package 400a of FIG. 4A with respect to an RF crosstalk behavior. One reason for this may be that no or only reduced coupling of RF signals 442 takes place into side surfaces of the insulating polymer layer 222. Furthermore, a coupling from a portion of the semiconductor material 220 occurs only indirectly, through coupling into the side surface of the further layer 220, and from there through the polymer layer 222 into the thinned chip 102T.

In various embodiments, as shown in FIG. 3, FIG. 4C to FIG. 4E, FIG. 5A to FIG. 5C, and FIG. 6A to FIG. 6C, each of which showing a schematic cross-sectional view of a chip package according to various embodiments, an RF behavior of the chip package 226 may further be improved as compared to the embodiment of FIG. 4B.

As shown in FIG. 4C, in a case of the further layer 220 including an insulating material (e.g. glass or ceramics), no coupling into the side walls of the further layer 220 may occur, and thus the RF behavior of the chip package 226c may be significantly improved over the RF behavior of the chip package 226b.

In that case, in various embodiments, the insulating further layer 220 may serve a further functionality as a carrier for an antenna (not shown). The antenna may be formed on the main surface of the further layer 220 that is facing away from the polymer layer 222W. In that case, the second grinding may be omitted.

However, insulating materials like glass or ceramics may be difficult to process.

FIG. 3 shows a method of forming a chip arrangement 226 in accordance with various embodiments. Since semiconductor material is much easier to process, it is advantageous to use a semiconductor material for the further layer 220, and to overcome the back-coupling behavior by other measures. In the following, embodiments are described that overcome or alleviate the problematic RF coupling when using semiconductor material as the further layer 220.

The method shown in FIG. 3 may differ from the method shown in FIG. 2A and as described above in how the wafer-sized stack 224W is formed. A repetition of portions of the description applying here is therefore mostly omitted.

Figure 4D:
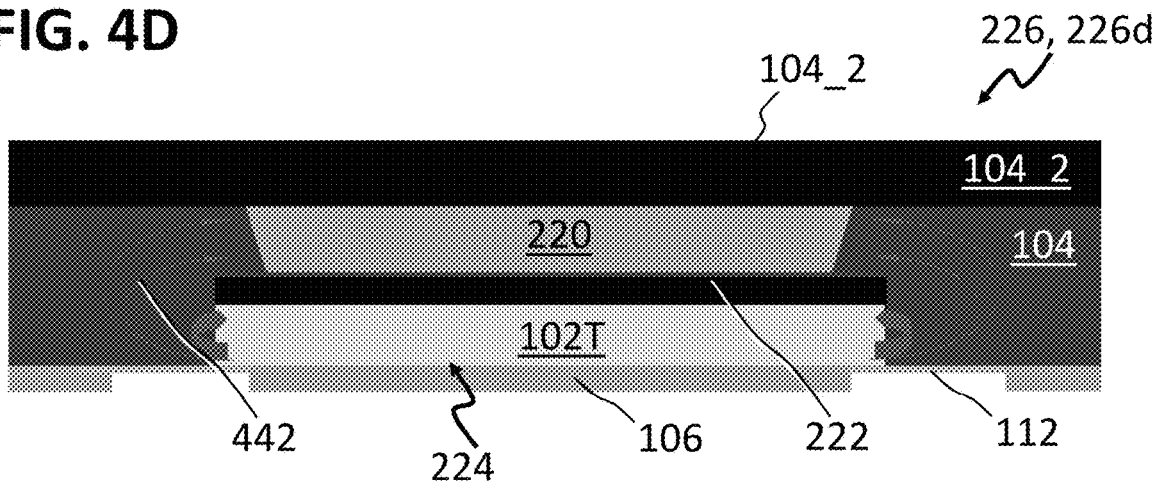

In various embodiments, as shown in FIG. 3 and FIG. 4D, side walls 220S of the further layer 220 joining the two main surfaces of the further layer 220 may be inclined in such a way that a main surface of the further layer 220 contacting the polymer layer 222 is smaller than an opposite (back) surface of the further layer 220.

Such a configuration may in various embodiments be achieved by forming the wafer-sized stack 224W as illustrated in FIG. 3 by forming grooves 330 in the further layer 220W. The grooves 330 may be formed by any suitable method of structuring a semiconductor wafer as known in the art, for example by sawing, laser processing, etching, or the like. The grooves 330 may be shaped in such a way that they are larger towards a surface of the further layer 220W, and smaller towards an inside of the further layer 220W. Their size and position may be configured such that, at the structured surface, islands of semiconductor material remain in such a pattern that over each of the chips 102T of the product wafer 102WT, on which the further layer 220W is to be arranged, one of the islands of semiconductor material may be arranged, and the grooves 330 may be arranged in areas in which the dicing of the wafer-sized stack 224W is foreseen, i.e. above scribe lines of the product wafer 102WT.

After the joining of the product wafer 102WT and the further layer 220W and before the singulating of the wafer-sized stack 224W, a back-grinding process may be applied, wherein the grinding may be continued until the grooves are opened, similar to a dice-before-grind process.

Thereby, the singulated stack 224 as shown in FIG. 3 may be formed, which may have the further layer 222 with the inclined side walls 220S as described above and shown in FIG. 3.

The inclined side walls 220S cause a step above the thin layer of the product chip 102T, thereby providing less direct area where the RF-waves 442 can couple in. This means that the RF-waves 442 almost only couple into the thin product chip 102T, such that the unwanted RF behavior is significantly reduced in the chip package 226d of FIG. 4D as compared to the chip package 226b of FIG. 4B having the straight side walls 220S.

Figure 4E:
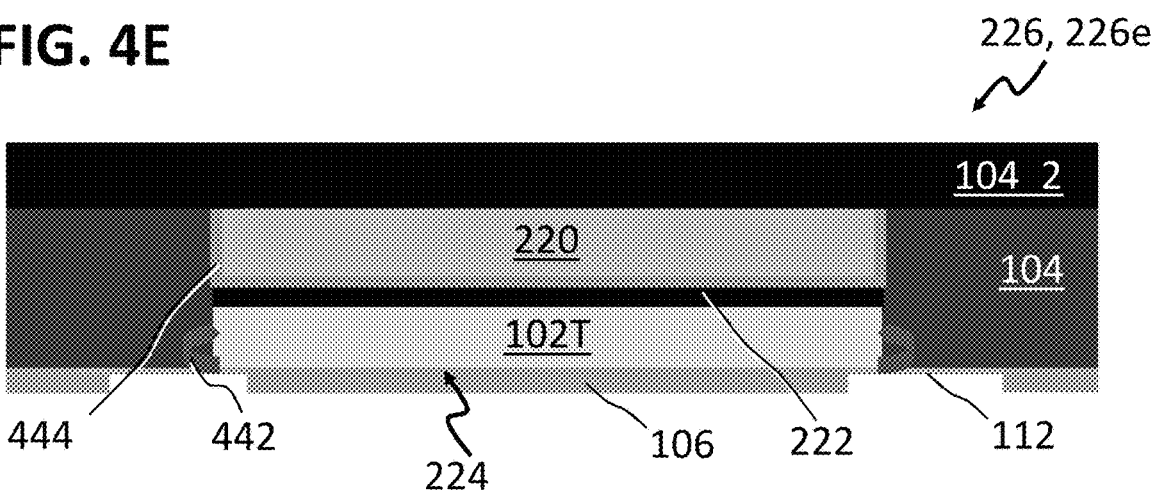

In another embodiment, as shown in FIG. 4E, the RF behavior of the chip package 226 may be improved by metallizing the (side) walls 220S of the further layer 220, e.g. of the semiconductor layer 220, with a metal layer 444. The RF-waves 442 do not penetrate into metal layer 444. In addition, the main surface of the further layer 220 that is in contact with the polymer layer 222 may be covered in whole or partially with the metal layer 444, as shown in FIG. 4E. In a case of the metal layer 444 being formed in a plating process, the metal layer 444 may also be referred to as metal plating 444. The metal layer 444 may be formed, e.g. deposited, by known processes. The metal layer 444 may be formed on the side wall 220S of the further layer 220. after the singulating of the wafer-sized stack 224W into individual stacks 224. The metal layer 444 may in various embodiments additionally cover side walls of the polymer layer 222 and/or of the product chip 102T. The metal layer 444 covering the main surface of the further layer 220 that is in contact with the polymer layer 222 may be formed on the wafer-sized further layer 220W before the arranging of the further layer 220W on the polymer layer 222W.

In various embodiments (not shown), instead of using a metal-coated further layer 220/220W, the further layer 220W may consist of or essentially consist of a metal layer 220W. In that case, the metal layer 220W may be pre-structured in such a way that a singulating of the wafer-sized stack 224W without a necessity to dice through the (whole) metal layer 220W.

In the chip package 226e, the RF-waves basically couple only into the thin product chip 102T, or in the case of its side walls also being covered by the metal layer 444 (not shown), not even that, such that the coupling into the chip 102T is significantly reduced.

Figure 4F:
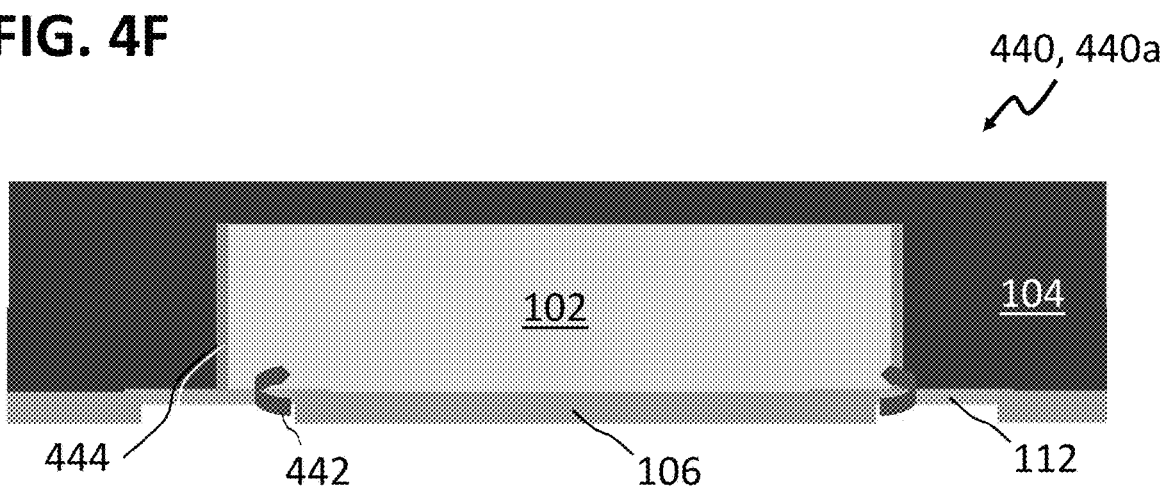

The covering the side walls of the chip with the metal layer 444 is a technique that may also be applied to a thick chip 102 used in a chip package 440, 440a as shown in FIG. 4F. Here, the metal layer 444 may be formed after the singulating a thick wafer 102W as shown in FIG. 1A into singulated chips 102, and before performing the recon processes (in particular the molding) on the singulated chips 102.

In the chip package 440, 440a, the RF-waves 442 can couple only over the frontside of the product die which is only minor coupling or can be prevented by chip design, e.g. doping of the active chip surface. This means that the coupling into the chip 102 is significantly reduced as compared to the chip package 400a of FIG. 4A.

Figure 5A:
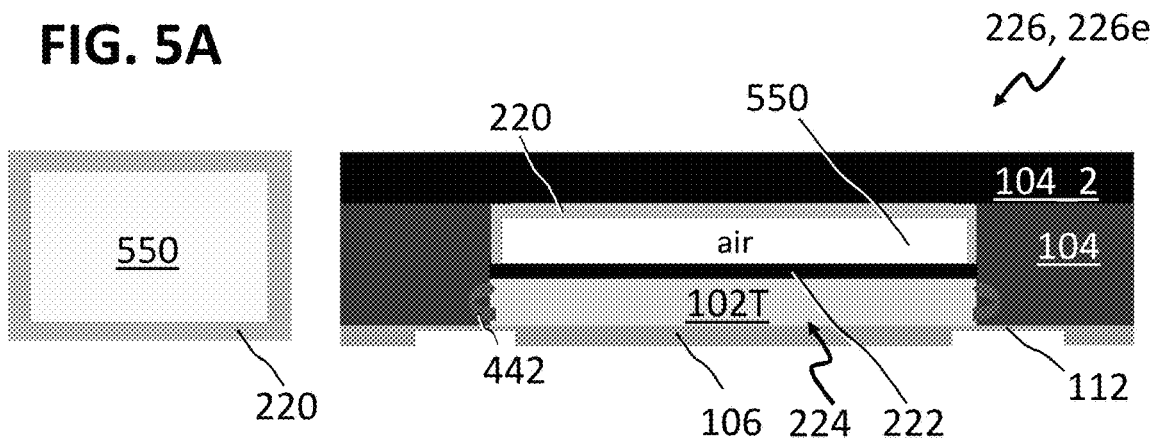
FIGS. 5A to 5C each show a schematic cross-sectional view of a chip package according to various embodiment.
Figure 5B:
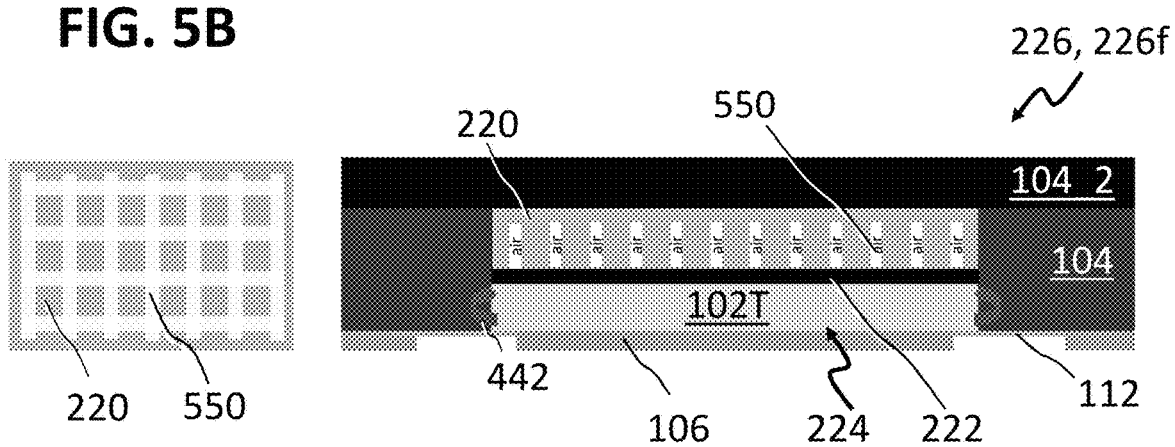
Figure 5C:
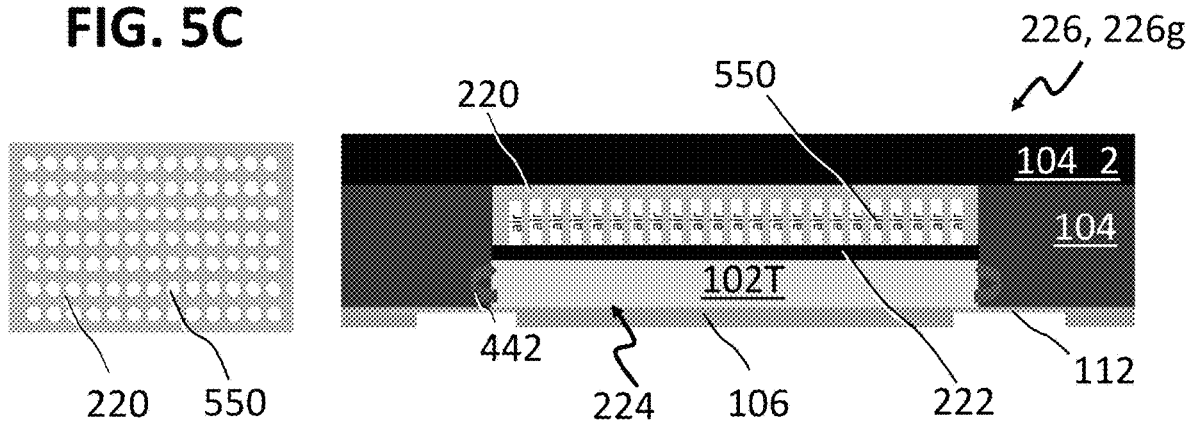

In various embodiments, as shown in FIG. 5A to FIG. 5C, the further (semiconductor) layer 220 may be structured in such a way that the structured further layer 220 includes, e.g. encloses, at least one cavity 550. The at least one cavity 550 may be air-filled, or, more generally, gas-filled. In other words, air is trapped behind, i.e. on a backside of the product chip 102T, which is beneficial regarding the RF performance.

One gas-filled cavity 550 that is arranged over sensitive areas of the chip 102T may be sufficient for improving the RF performance of the chip package 226.

The at least one gas-filled cavity 550 may for example be formed as one large cavity 550 extending over essentially the whole chip 102T, except for portions with which the further layer 220 is attached to the polymer layer 222 (in FIG. 5A a closed rectangular ring near the edge of the stack 224).

In various embodiments, the at least one gas-filled cavity 550 may include a structured cavity 550, e.g. a grid-shaped cavity as shown in FIG. 5B, and/or a plurality of cavities 550 as shown in FIG. 5C.

The at least one gas-filled cavity 550 may be formed by any suitable method of structuring a semiconductor wafer as known in the art, for example by sawing, etching, (laser) dicing, (laser) drilling, or the like. For example, sawing or laser dicing may be suitable for forming the grid-shaped cavity 550 of FIG. 5B, etching may be used for forming any of the cavities 550 of FIG. 5A, 5B or 5C, and laser drilling may be used for forming the plurality of cavities 550 of FIG. 5C.

Various other shapes and configurations of the gas-filled cavity 550 may serve the same functionality as the shown examples.

Figure 6A:
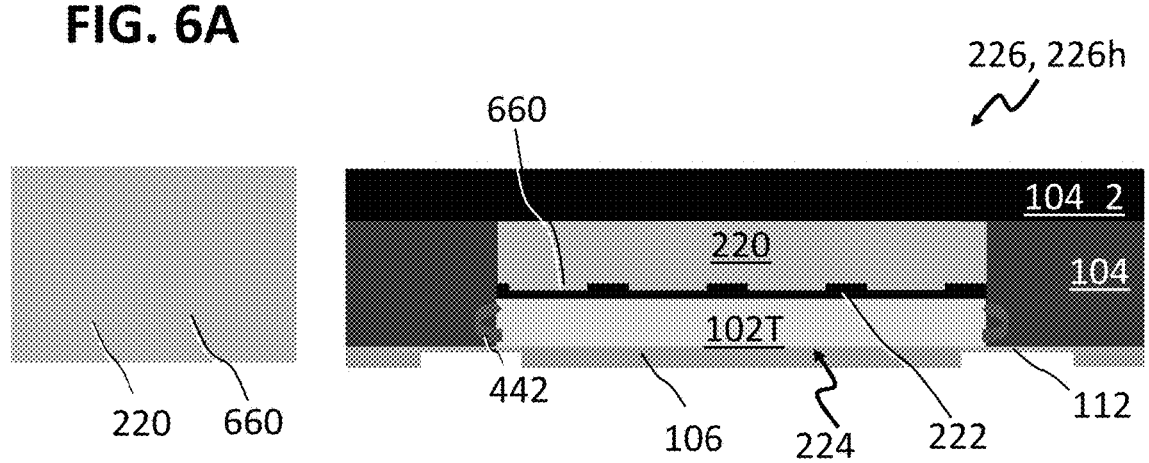
FIGS. 6A to 6C each show a schematic cross-sectional view of a chip package according to various embodiment.
Figure 6B:
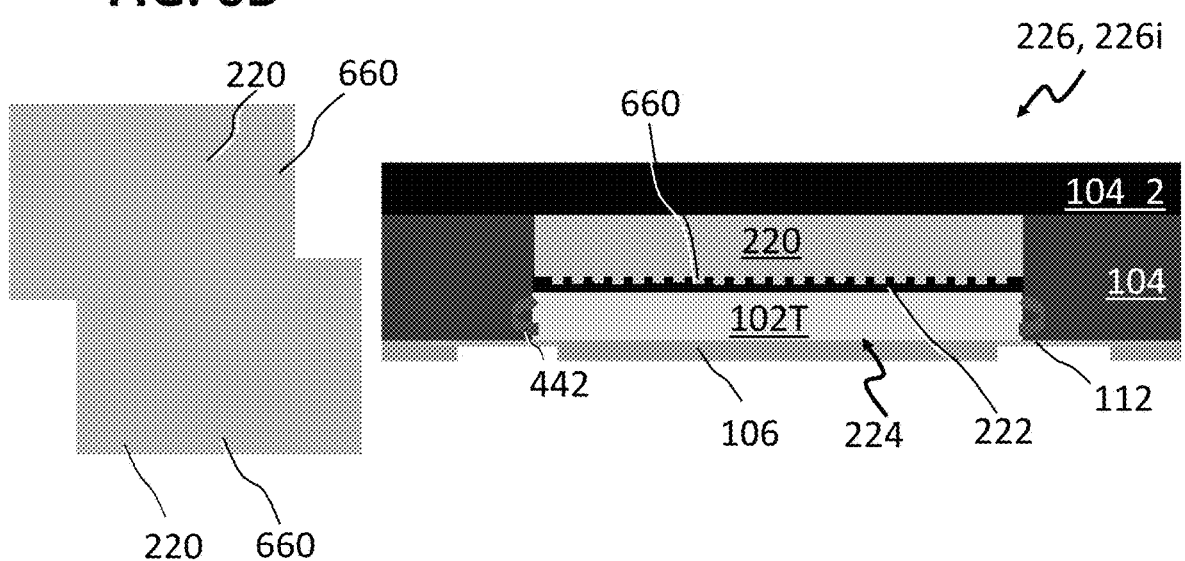
Figure 6C:
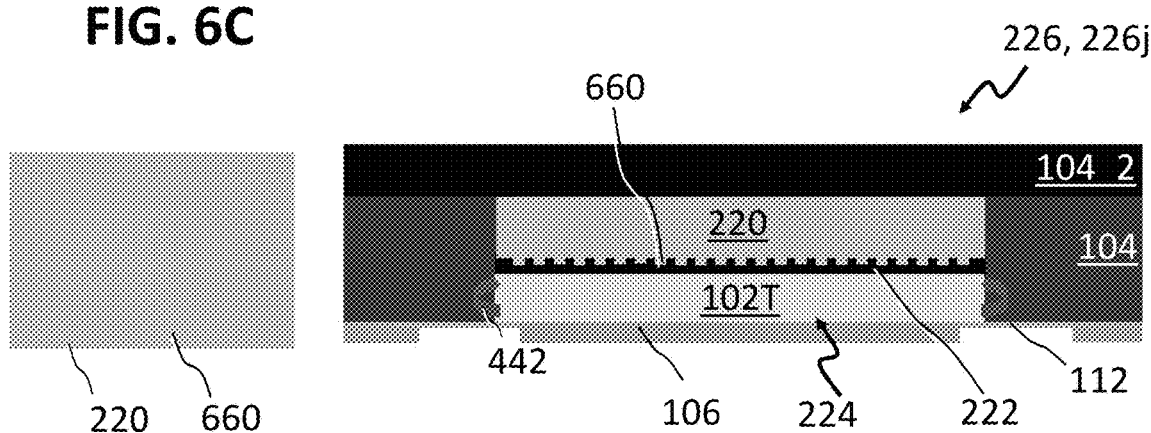

In various embodiments, as shown in FIG. 6A to FIG. 6C, the further (semiconductor) layer 220 may be formed in such a way that a structured metallization 660 is formed on the wafer-sized semiconductor layer 220W. The further layer 220W may be arranged in such a way that the structured metallization 660 is in contact with the polymer layer 222W. The structured metallization 660 may be formed on the further (semiconductor) layer 220W by known processes of forming a structured metallization 660 on a (semiconductor) substrate, e.g. by depositing metal (e.g. copper, aluminium, titanium, or other metals as used in the art) as a structured metallization 660 using a masking process, or by depositing the metal as an unstructured metallization layer and structuring it, e.g. using an etching process, to form the structured metallization 660.

In various embodiments, as shown in the exemplar embodiment of FIG. 6A, it may be sufficient to arrange the metallization 660 over RF-sensitive areas of the chip 102T for improving the RF performance of the chip package 226h.

In various embodiments, as shown in the exemplar embodiment of FIG. 6B, the metallization 660 may be arranged in a grid-like or striped fashion for improving the RF performance of the chip package 226i.

In various embodiments, as shown in the exemplar embodiment of FIG. 6C, the metallization 660 may be arranged as an array of dots for improving the RF performance of the chip package 226j.

Various other shapes and configurations of the structured metallization 660 may serve the same functionality as the shown examples.

In various embodiments, the metallization 660 may be covered by one or more cover layers (not shown) as part of the further layer 220 before arranging the further layer 220 on the polymer layer 222. Thus, the structured metallization 660 may be arranged within the further layer 220, with the same or a comparable functionality as for the metallization 660 that is arranged on the outer surface of the further layer 220.

In various embodiments, the "metallization" 660 may include not only metal as described above, but also electrically conductive portions of the further semiconductor layer 220, which may for example have been doped for forming the electrically conductive portions of the metallization 660.

In the following table, advantages regarding the warpage behavior and regarding the electrical behavior (i.e., RF behavior) of chip packages formed using a further layer 220 as described in the first column are summarized, wherein "Pseudo Slim approach" refers to the methods described above in context with FIG. 2A and FIG. 3, and to the advantages described in that context.

| Sacrifice wafer (further layer 220) | Advantages for warpage behaviour | Advantages for electrical behaviour |
| --- | --- | --- |
| Semiconductor wafer | Pseudo Slim approach | Every insulator has advantage in RF-performance* |
| Semiconductor with doping | Pseudo Slim approach | Cross talk can be influenced depending on doping |
| "normal" glass | Pseudo Slim approach | Every insulator has advantage in RF-performance |
| CTE-adapted glass | Additional Pro to Pseudo Slim approach | Every insulator has advantage in RF-performance |
| Moldwafer | Pseudo Slim approach | Every insulator has advantage in RF-performance |
| CTE-adapted Mold | Additional Pro to Pseudo Slim approach | Every insulator has advantage in RF-performance |
| Metal wafer → high CTE compared to Si | Additional Pro to Pseudo Slim approach | Metal may act as RF-mirror and act as heat sink |

*here, the "insulator" refers to the polymer layer arranged between the semiconductor product layer 102 and the semiconductor further layer 220.

By applying metallization 660 in a characteristic and defined pattern, the RF waves 442 will be extinguished. However, as explained in context with FIG. 4E, also the unstructured metallization 444 between the further layer 220 and the chip 102T may be efficient in improving the RF performance.

In various further embodiments (not shown), a material used for the further layer may be easily structurable to arrange air behind the product wafer 102T, similar to what was described in context with FIG. 5A to 5C, but instead of using the semiconductor material, using the easily structurable material. This material may be arranged on the product wafer 102W in solid state, e.g. as a wafer 220W, or in liquid/semi-liquid state.

In various embodiments of the material requiring an adhesive for fixing the further layer 220W to the product wafer 102W, the polymer layer 222W may be arranged between the product wafer 102W and the easily structurable material forming the further layer 220W, as described above in context with FIG. 2A. This may for example apply to a laminate or a glass (which may be provided with (laser) drilled blind vias as the cavities 550), and/or to a porous material (semiconductor, glass, certain polymers, metal foam, . . . ), etc.

In various embodiments of the material being self-adhesive, the material may be arranged directly on the product wafer 102W, e.g. in a case of certain polymers (e.g. foamed PU or the like).

FIG. 7 shows a process flow 700 for a method of forming a chip arrangement according to various embodiments.

The method may include arranging a plurality of stacks on a carrier, each of the stacks including a thinned semiconductor chip, a further layer, and a polymer layer between the further layer and the chip, wherein each of the stacks is arranged with the chip facing the carrier (in 710), joining the plurality of stacks with each other with an encapsulation material to form a chip arrangement (in 720), exposing the further layer (in 730), and forming a redistribution layer contacting the chips of the chip arrangement (in 740).

The method may further optionally include, after the arranging the redistribution layer, removing the further layer, thereby exposing the polymer layer (in 750).

FIG. 8 shows a process flow 800 for a method of forming a chip arrangement according to various embodiments.

The method may include arranging a plurality of stacks on a carrier, each of the stacks including a thinned semiconductor chip and a further layer, wherein the further layer includes at least one gas-filled cavity, and wherein each of the stacks is arranged with the chip facing the carrier (in 810), joining the plurality of stacks with each other with an encapsulation material to form the chip arrangement (in 820), exposing the further layer (in 830), and forming a redistribution layer contacting the chips of the chip arrangement (in 840).

Figure 9:
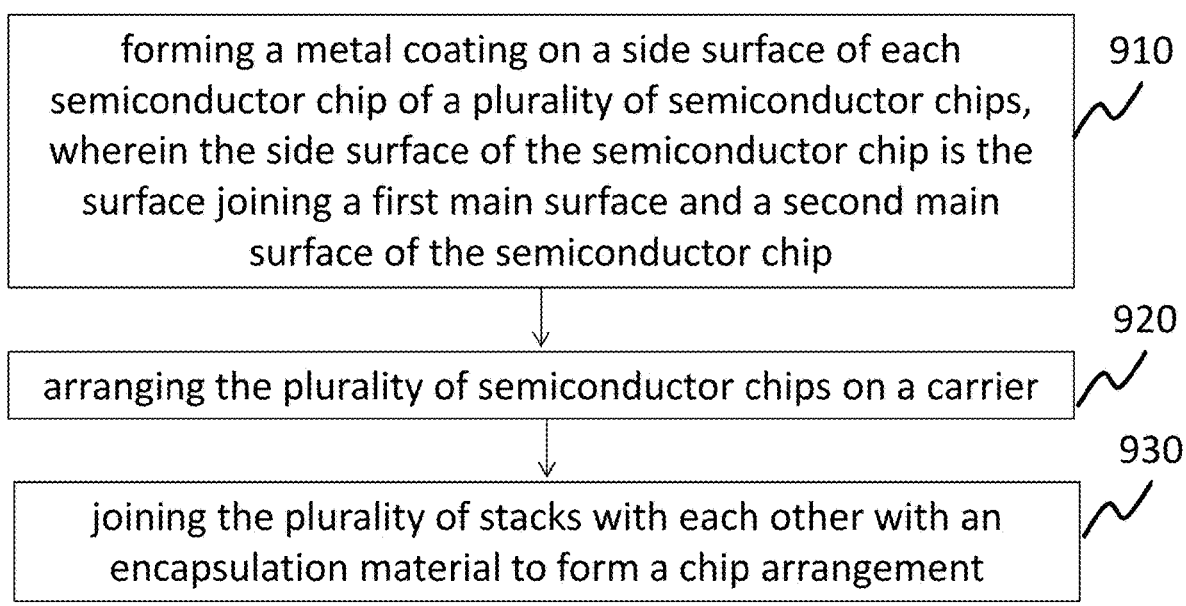
FIG. 9 shows a process flow for a method of forming a chip arrangement according to various embodiments.

FIG. 9 shows a process flow 900 for a method of forming a chip arrangement according to various embodiments.

The method may include forming a metal coating on a side surface of each semiconductor chip of a plurality of semiconductor chips, wherein the side surface of the semiconductor chip is the surface joining a first main surface and a second main surface of the semiconductor chip (in 910), arranging the plurality of semiconductor chips on a carrier (in 920), and joining the plurality of stacks with each other with an encapsulation material to form the chip arrangement (in 930).

Various examples will be illustrated in the following:

Example 1 is a method of forming a chip arrangement. The method may include arranging a plurality of stacks on a carrier, each of the stacks including a thinned semiconductor chip, a further layer, and a polymer layer between the further layer and the chip, wherein each of the stacks is arranged with the chip facing the carrier, joining the plurality of stacks with each other with an encapsulation material to form the chip arrangement, exposing the further layer, and forming a redistribution layer contacting the chips of the chip arrangement.

In Example 2, the subject-matter of Example 1 may optionally include that the method further includes after the arranging the redistribution layer, removing the further layer, thereby exposing the polymer layer.

In Example 3, the subject matter of any one of Examples 1 or 2 may optionally include that the removing the further layer is a grinding of the chip arrangement from a side of the further layer.

In Example 4, the subject matter of any one of Examples 2 or 3 may optionally include that the removing the further layer is stopped when the polymer layer is reached, such that at least a portion of the polymer layer remains as a protective layer on the further layer.

In Example 5, the subject matter of any one of Examples 2 to 4 may optionally include that a thickness of the chip arrangement after the removing the further layer is in a range from about 100 µm to about 550 µm.

In Example 6, the subject matter of any one of Examples 1 to 5 may optionally include that a material of the polymer layer is different from the encapsulation material.

In Example 7, the subject matter of any one of Examples 1 to 6 may optionally include that the polymer layer is an adhesive layer.

In Example 8, the subject matter of any one of Examples 1 to 7 may optionally include that the polymer layer is thinner than the further layer.

In Example 9, the subject matter of any one of Examples 1 to 8 may optionally include that the coefficient of thermal expansion of the further layer is different from the coefficient of thermal expansion of the chip.

In Example 10, the subject matter of any one of Examples 1 to 9 may optionally include that the further layer includes at least one material of a group of materials, the group including: a semiconductor, a dielectric, and an electrically conductive material.

In Example 11, the subject matter of any one of Examples 1 to 10 may optionally include that the material of the further layer is selected with a coefficient of thermal expansion and formed with a thickness in such a way that a tension acting on the thinned chip during the forming of the redistribution layer is at least partially compensated.

Example 12 is a method of forming a chip arrangement. The method may include arranging a plurality of stacks on a carrier, each of the stacks including a thinned semiconductor chip and a further layer, wherein the further layer includes at least one gas-filled cavity, and wherein each of the stacks is arranged with the chip facing the carrier, joining the plurality of stacks with each other with an encapsulation material to form the chip arrangement, exposing the further layer, and forming a redistribution layer contacting the chips of the chip arrangement.

In Example 13, the subject matter of Example 12 may optionally include that the at least one gas-filled cavity is arranged in the further layer in such a way that a first main surface of the further layer facing away from the chip is unstructured.

In Example 14, the subject matter of Example 12 or 13 may optionally include that the at least one gas-filled cavity is a plurality of gas-filled cavities.

In Example 15, the subject matter of any one of Examples 12 to 14 may optionally include that the further layer includes a structured metallization.

In Example 16, the subject matter of Example 15 may optionally include that the structured metallization is arranged in the further layer or on a second main surface of the further layer facing the chip.

In Example 17, the subject matter of any one of Examples 12 to 16 may optionally include that the further layer includes a porous material.

In Example 18, the subject matter of any one of Examples 12 to 17 may optionally include that the further layer includes a laminate material.

In Example 19, the subject matter of any one of Examples 12 to 18 may optionally include that the further layer includes an antenna arranged thereon or therein.

In Example 20, the subject matter of any one of Examples 12 to 19 may optionally include that the method further includes forming a metal layer on a side surface of the further layer.

In Example 21, the subject matter of any one of Examples 12 to 20 may optionally include that the method further includes, after the arranging the redistribution layer, forming further encapsulation over the exposed further layer.

In Example 22, the subject matter of any one of Examples 12 to 21 may optionally include that a thickness of the chip arrangement is in a range from about 820 µm to about 900 µm.

In Example 23, the subject matter of any one of Examples 1 to 19 may optionally include that the method further includes, before the arranging the plurality of stacks, forming the plurality of stacks, including: fixing a wafer-sized further layer on a thinned wafer including the plurality of chips, and singulating the thinned wafer with the wafer-sized layer arranged thereon into the plurality of stacks.

In Example 24, the subject matter of Example 23 may optionally include that the fixing the wafer-sized further layer on the thinned wafer includes arranging a polymer layer on the thinned wafer and arranging the wafer-sized further layer on the polymer layer.

In Example 25, the subject matter of Example 24 may optionally include that the polymer forms an adhesive between the wafer and the wafer-sized further layer.

In Example 26, the subject matter of any of Examples 23 to 25 may optionally include that the method further includes forming a plurality of tapered grooves in the wafer-sized further layer before the fixing the wafer-sized further layer on the wafer with the tapered grooves facing the wafer, wherein the grooves are wider near the wafer and are arranged over border regions between adjacent chips of the plurality of chips, such that, in each of the stacks, a first main surface of the further layer facing away from the chip is larger than a second main surface of the further layer arranged on the chip, such that a side surface of the further layer is inclined.

Example 27 is a method of forming a chip arrangement. The method may include forming a metal coating on a side surface of each semiconductor chip of a plurality of semiconductor chips, wherein the side surface of the semiconductor chip is the surface joining a first main surface and a second main surface of the semiconductor chip, arranging the plurality of semiconductor chips on a carrier, and joining the plurality of stacks with each other with an encapsulation material to form the chip arrangement.

Example 28 is a chip arrangement. The chip arrangement may include a plurality of stacks, each of the stacks including a thinned semiconductor chip and a polymer layer, wherein the thinned semiconductor chips form part of a first main surface of the chip arrangement and the polymer layer forms part of the second main surface opposite the first main surface of the chip arrangement, an encapsulation material joining the plurality of stacks, wherein the encapsulation material is different from a material of the polymer layer, and a redistribution layer contacting the chips of the chip arrangement.

Example 29 is a chip arrangement. The chip arrangement may include a plurality of stacks, each of the stacks including a thinned semiconductor chip and a further layer, wherein the thinned semiconductor chips form part of a first main surface of the chip arrangement, an encapsulation material joining the plurality of stacks, and a redistribution layer contacting the chips of the chip arrangement, wherein the further layer includes at least one gas-filled cavity.

Example 30 is a chip arrangement. The chip arrangement may include a plurality of stacks, each of the stacks including a thinned semiconductor chip and a further layer, wherein the thinned semiconductor chips form part of a first main surface of the chip arrangement, an encapsulation material joining the plurality of stacks, and a redistribution layer contacting the chips of the chip arrangement, wherein, in each stack, a first main surface of the further layer facing away from the chip is larger than a second main surface of the further layer arranged on the chip, such that a side surface of the further layer is inclined.

Example 31 is a chip arrangement. The chip arrangement may include a plurality of stacks, each of the stacks including a thinned semiconductor chip, a further layer, and a structured metal layer between the chip and the further layer, wherein the thinned semiconductor chips form part of a first main surface of the chip arrangement, an encapsulation material joining the plurality of stacks, and a redistribution layer contacting the chips of the chip arrangement.

Example 32 is a chip arrangement. The chip arrangement may include a plurality of semiconductor chips, wherein each of the semiconductor chips has a metal coating on its side surface, wherein the side surface joins a first main surface and a second main surface of the chip, and an encapsulation material joining the plurality of semiconductor chips.

Example 33 is a method of forming a chip package. The method may include forming a chip arrangement using the method of any of Examples 1 to 27, removing the chip arrangement from the carrier, and singulating the chip arrangement into a plurality of chip packages.

Example 34 is a chip package. The chip package may include a thinned semiconductor chip forming a part of a first main surface of the chip package and having a redistribution layer formed thereon, a polymer layer on the semiconductor chip forming a part of a second main surface of the chip, and an encapsulation forming a side surface, a part of the first main surface and a part of the second main surface of the chip package, wherein the material of the polymer layer is different from a material of the encapsulation.

Example 35 is a chip package. The chip package may include a thinned semiconductor chip forming a part of a first main surface of the chip package and having a redistribution layer formed thereon, a further layer on the semiconductor chip, and an encapsulation forming a side surface, a part of the first main surface and at least a part of the second main surface of the chip package, wherein the further layer includes at least one gas-filled cavity.

Example 36 is a chip package. The chip package may include a thinned semiconductor chip forming a part of a first main surface of the chip package and having a redistribution layer formed thereon, a further layer on the semiconductor chip, a structured metal layer between the thinned semiconductor chip and the further layer, and an encapsulation forming a side surface, a part of the first main surface and at least a part of the second main surface of the chip package.

Example 37 is a chip package. The chip package may include a thinned semiconductor chip forming a part of a first main surface of the chip package and having a redistribution layer formed thereon, a further layer on the semiconductor chip, and an encapsulation forming a side surface, a part of the first main surface and at least a part of the second main surface of the chip package, wherein a first main surface of the further layer facing away from the chip is larger than a second main surface of the further layer arranged on the chip, such that a side surface of the further layer is inclined.

In Example 38, the subject matter of any of Examples 35 to 37 may optionally further include an antenna arranged on a main surface of the further layer facing away from the chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    arranging a plurality of stacks on a carrier, each stack comprising a thinned semiconductor chip, a further layer and a polymer layer between the further layer and the thinned semiconductor chip, each stack being arranged with the thinned semiconductor chip facing the carrier;
    joining the plurality of stacks with each other with an encapsulation material to form a chip arrangement;
    exposing the further layer; and
    subsequently forming a redistribution layer contacting the thinned semiconductor chips of the chip arrangement.

2. The method of claim 1, further comprising:
    after forming the redistribution layer, removing the further layer to expose the polymer layer.

3. The method of claim 2, wherein removing the further layer comprises grinding the chip arrangement from a side of the further layer.

4. The method of claim 2, further comprising:
    stopping a process used to remove the further layer when the polymer layer is reached, such that at least a portion of the polymer layer remains as a protective layer on the thinned semiconductor chip.

5. The method of claim 2, wherein a thickness of the chip arrangement after the further layer is removed is in a range from about 100 µm to about 550 µm.

6. The method of claim 1, wherein a material of the polymer layer is different from the encapsulation material.

7. The method of claim 1, wherein the polymer layer is an adhesive layer.

8. The method of claim 1, wherein the polymer layer is thinner than the further layer.

9. The method of claim 1, wherein the coefficient of thermal expansion of the further layer is different from the coefficient of thermal expansion of the thinned semiconductor chip.

10. The method of claim 1, wherein the further layer comprises a semiconductor, a dielectric and/or an electrically conductive material.

11. The method of claim 1, wherein a material of the further layer is selected with a coefficient of thermal expansion and formed with a thickness in such a way that a tension acting on the thinned semiconductor chip during the forming of the redistribution layer is at least partially compensated.

12. The method of claim 1, further comprising:
    before arranging the plurality of stacks on the carrier, forming the plurality of stacks by:
        fixing a wafer-sized further layer on a thinned wafer comprising the plurality of thinned semiconductor chips; and
        singulating the thinned wafer with the wafer-sized layer arranged thereon into a plurality of stacks.

13. The method of claim 12, wherein fixing the wafer-sized further layer on the thinned wafer comprises:
    arranging a polymer layer on the thinned wafer; and
    arranging the wafer-sized further layer on the polymer layer.

14. The method of claim 13, wherein the polymer layer forms an adhesive between the wafer and the wafer-sized further layer.

15. The method of claim 12, further comprising:
    forming a plurality of conically tapered grooves in the wafer-sized further layer before fixing the wafer-sized further layer on the wafer with the conically tapered grooves facing the wafer,
    wherein the grooves are wider near the wafer and are arranged over border regions between adjacent thinned semiconductor chips of the plurality of thinned semiconductor chips, such that, in each stack, a first main surface of the further layer facing away from the thinned semiconductor chip is larger than a second main surface of the further layer arranged on the thinned semiconductor chip, such that a side surface of the further layer is inclined.

16. The method of claim 1, further comprising:
    removing the chip arrangement from the carrier; and
    singulating the chip arrangement into a plurality of chip packages.

17. A method, comprising:
    arranging a plurality of stacks on a carrier, each stack comprising a thinned semiconductor chip and a further layer, the further layer comprising at least one gas-filled cavity, each stack being arranged with the thinned semiconductor chip facing the carrier;
    joining the plurality of stacks with each other with an encapsulation material to form a chip arrangement;
    exposing the further layer; and
    subsequently forming a redistribution layer contacting the thinned semiconductor chips of the chip arrangement.

18. The method of claim 17, wherein the at least one gas-filled cavity is arranged in the further layer in such a way that a first main surface of the further layer facing away from the thinned semiconductor chip is unstructured.

19. The method of claim 17, wherein the at least one gas-filled cavity is a plurality of gas-filled cavities.

20. The method of claim 17, wherein the further layer comprises a structured metallization.

21. The method of claim 20, wherein the structured metallization is arranged in the further layer or on a second main surface of the further layer facing the thinned semiconductor chip.

22. The method of claim 17, wherein the further layer comprises a porous material.

23. The method of claim 17, wherein the further layer comprises a laminate material.

24. The method of claim 17, wherein the further layer comprises an antenna arranged thereon or therein.

25. The method of claim 17, further comprising:
    forming a metal layer on a side surface of the further layer.

26. The method of claim 17, further comprising:
after forming the redistribution layer, forming a further encapsulation over the exposed further layer.

27. The method of claim 17, wherein a thickness of the chip arrangement is in a range from about 820 µm to about 900 µm.

28. The method of claim 17, further comprising:
before arranging the plurality of stacks on the carrier, forming the plurality of stacks by:
fixing a wafer-sized further layer on a thinned wafer comprising the plurality of thinned semiconductor chips; and
singulating the thinned wafer with the wafer-sized layer arranged thereon into a plurality of stacks.

29. The method of claim 28, wherein fixing the wafer-sized further layer on the thinned wafer comprises:
arranging a polymer layer on the thinned wafer; and
arranging the wafer-sized further layer on the polymer layer.

30. The method of claim 29, wherein the polymer layer forms an adhesive between the wafer and the wafer-sized further layer.

31. The method of claim 28, further comprising:

forming a plurality of conically tapered grooves in the wafer-sized further layer before fixing the wafer-sized further layer on the wafer with the conically tapered grooves facing the wafer, wherein the grooves are wider near the wafer and are arranged over border regions between adjacent thinned semiconductor chips of the plurality of thinned semiconductor chips, such that, in each stack, a first main surface of the further layer facing away from the thinned semiconductor chip is larger than a second main surface of the further layer arranged on the thinned semiconductor chip, such that a side surface of the further layer is inclined.

32. The method of claim 17, further comprising:

removing the chip arrangement from the carrier; and singulating the chip arrangement into a plurality of chip packages.

* * * * *